US007009292B2

(12) United States Patent
Miura et al.

(10) Patent No.: US 7,009,292 B2
(45) Date of Patent: Mar. 7, 2006

(54) PACKAGE TYPE SEMICONDUCTOR DEVICE

(75) Inventors: Shoji Miura, Nukata-gun (JP); Akihiro Niimi, Nagoya (JP); Yoshimi Nakase, Anjo (JP); Takanori Teshima, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/959,963

(22) Filed: Oct. 8, 2004

(65) Prior Publication Data

US 2005/0077599 A1    Apr. 14, 2005

(30) Foreign Application Priority Data

Oct. 10, 2003   (JP)   ............................. 2003-352508

(51) Int. Cl.
*H01L 29/78* (2006.01)
(52) U.S. Cl. .................. 257/718; 257/720; 257/328; 257/330; 257/178
(58) Field of Classification Search ........ 257/718–720, 257/328–331, 341, 177, 178, 181
See application file for complete search history.

(56) References Cited

U.S. PATENT DOCUMENTS

| 5,831,291 A | * | 11/1998 | Evans et al. ................ 257/137 |
| 6,703,707 B1 | | 3/2004 | Mamitsu et al. ............ 257/718 |
| 6,803,667 B1 | * | 10/2004 | Okura et al. ................ 257/792 |

FOREIGN PATENT DOCUMENTS

| JP | 08222732 A | * | 8/1996 |
| JP | 2003133329 A | * | 5/2003 |

* cited by examiner

*Primary Examiner*—Minh-Loan Tran
(74) *Attorney, Agent, or Firm*—Posz Law Group, PLC

(57) ABSTRACT

A package type semiconductor device comprising: a semiconductor chip having a semiconductor part; a main electrode for connecting to a first region of the semiconductor part; a control wiring layer for connecting to a second region of the semiconductor part; a blocking member electrically isolated from the control wiring layer; a first metallic layer; a protection film disposed among the main electrode, the control wiring layer and the blocking member; and a metal block for connecting to the main electrode through the first metallic layer. The chip, the main electrode, the control wiring layer, the blocking member, and the metal block are packaged. The blocking member is disposed between the main electrode and the control wiring layer.

15 Claims, 8 Drawing Sheets

PACKAGE TYPE SEMICONDUCTOR DEVICE

CROSS REFERENCE TO RELATED APPLICATION

This application is based on Japanese Patent Application No. 2003-352508 filed on Oct. 10, 2003, the disclosure of which is incorporated herein by reference.

FIELD OF THE INVENTION

The present invention relates to a package type semiconductor device.

BACKGROUND OF THE INVENTION

Recently, it is required to reduce a manufacturing cost for manufacturing a semiconductor power device. Specifically, the semiconductor power device is suitably used for an inverter of an automotive vehicle. To reduce the manufacturing cost of the power device, a method for decreasing dimensions of the power device and for decreasing the number of parts in the power deice is provided. In this case, improvement of heat radiation from a semiconductor chip is necessitated. This is because heat generation of the power device becomes larger since the semiconductor power device such as an IGBT (i.e., an insulated gate bipolar transistor) or a MOSFET (i.e., a metal-oxide semiconductor field effect transistor) has high withstand voltage and large capacity of current flow. Specifically, in case of reducing the dimensions of the device and reducing the number of the parts in the device, it is much required to improve the heat radiation of the device.

A package type semiconductor device disclosed in Unexamined Japanese Patent Application Publication No. H13-156225 (which corresponds to U.S. Pat. No. 6,703,707-B1) can reduce heat resistance of a power device so that improvement of heat radiation of the device is performed. In the package type semiconductor device, a semiconductor power device is formed on both of a semiconductor chip. A pair of heat sinks is bonded to both sides of the semiconductor chip through a solder layer. Thus, the heat generated in the power device can be radiated from both sides of the semiconductor chip so that the heat radiation is improved.

However, in the device, a gate runner as a gate wiring layer may short with an emitter electrode, i.e., a main electrode, disposed on a principal surface of the device. Specifically, when the device is used in a temperature range between −65° C. and +150° C., a thermal stress is generated in the main electrode such as an emitter electrode and a backside electrode, which are disposed on both sides of the device. This stress is caused by a difference of thermal expansion coefficient between a heat sink and the device or between a metal block and the device. Here, the heat sink and the metal block are disposed on both sides of the device for radiating the heat generated in the device. Since the thermal stress is generated in the main electrodes, a strain is accumulated in the electrodes. Thus, the main electrode is damaged in a horizontal direction of the device, i.e., in a direction parallel to a substrate of the device so that the main electrode contacts the gate wiring layer. Thus, the main electrode and the gate wiring layer may short. Thus, the device does not work appropriately.

SUMMARY OF THE INVENTION

In view of the above-described problem, it is an object of the present invention to provide a package type semiconductor device with a semiconductor chip and a heat radiation plate having high durability.

A package type semiconductor device includes: a semiconductor chip having a semiconductor part; a main electrode disposed on a principal surface of the chip for electrically connecting to a first region of the semiconductor part; a control wiring layer disposed on the principal surface of the chip for electrically connecting to a second region of the semiconductor part and for controlling an electric potential of the second region of the semiconductor part; a blocking member disposed on the principal surface of the chip and electrically isolated from the control wiring layer; a first metallic layer disposed on the principal surface of the chip; a protection film disposed among the main electrode, the control wiring layer and the blocking member; and a metal block for covering at least a part of the main electrode and the control wiring layer and for electrically connecting to the main electrode through the first metallic layer. The chip, the main electrode, the control wiring layer, the blocking member, and the metal block are packaged. The blocking member is disposed between the main electrode and the control wiring layer.

In this device, even when the first metallic layer shifts, the main electrode does not electrically connect to the control wiring layer so that no short circuit between the main electrode and the control wiring layer is occurred in the chip. Thus, the semiconductor part works correctly. Thus, the thermal durability of the chip is improved so that the device has high durability.

Further, a package type semiconductor device includes: a semiconductor chip having a semiconductor part; a main electrode disposed on a principal surface of the chip for electrically connecting to a first region of the semiconductor part; a control wiring layer disposed on the principal surface of the chip for electrically connecting to a second region of the semiconductor part and for controlling an electric potential of the second region of the semiconductor part; a stress relaxation wiring layer disposed on the principal surface of the chip and electrically isolated from the control wiring layer; a first metallic layer disposed on the principal surface of the chip; a second metallic layer disposed on a surface of the stress relaxation wiring layer; a protection film for covering the main electrode, the control wiring layer and the blocking member; and a metal block for covering at least a part of the main electrode and the control wiring layer for electrically connecting to the main electrode through the first metallic layer. The chip, the main electrode, the control wiring layer, the blocking member, and the metal block are packaged. The stress relaxation wiring layer is disposed outside of the main electrode and connect to the metal block.

In this device, even when the first metallic layer shifts, the main electrode does not electrically connect to the control wiring layer so that no short circuit between the main electrode and the control wiring layer is occurred in the chip. Thus, the semiconductor part works correctly. Thus, the thermal durability of the chip is improved so that the device has high durability.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS (First Embodiment)

Figure 11A:
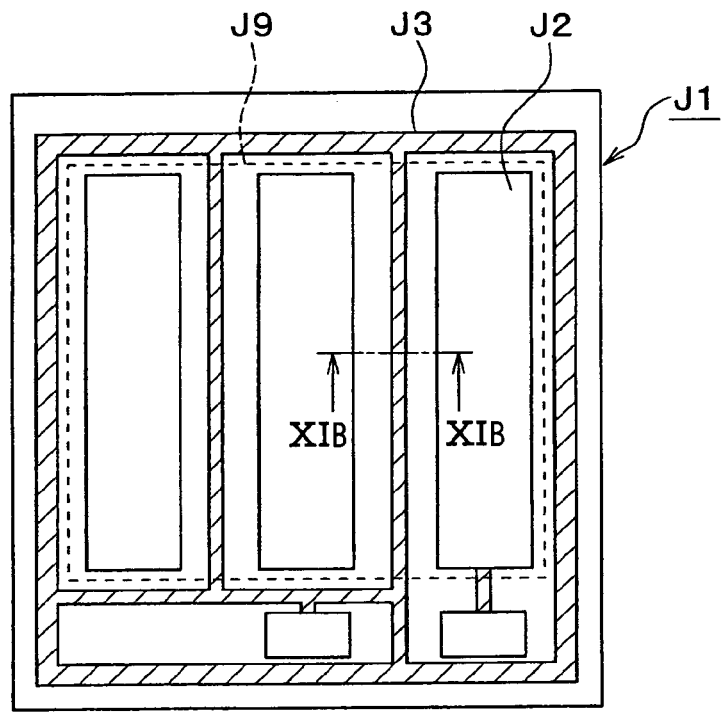
FIG. 11A is a plan view showing a semiconductor chip as a comparison.
Figure 11B:
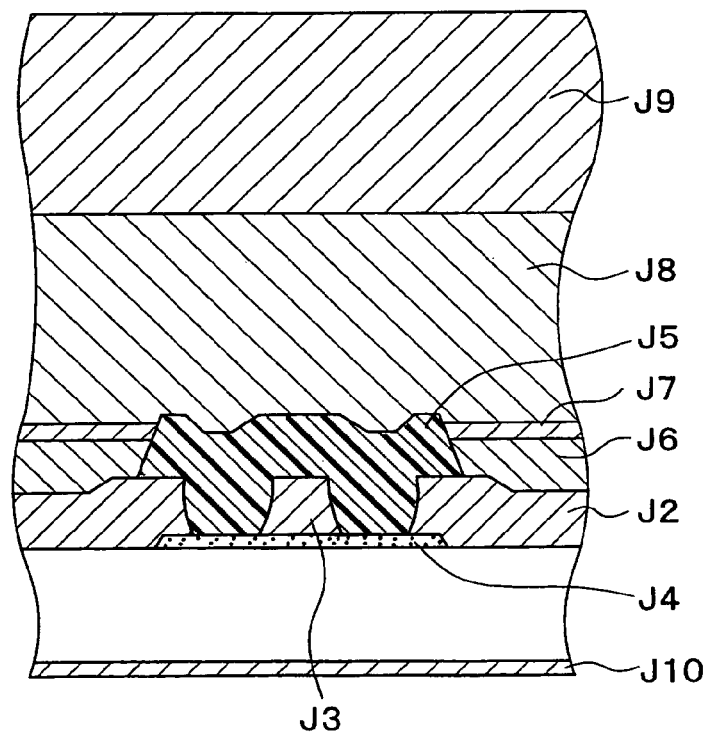
FIG. 11B is a cross sectional view showing the chip taken along line XIB—XIB in FIG. 11A, according to the first embodiment.

The inventors have preliminarily studied about a package type semiconductor device having a semiconductor chip and a heat radiation plate. As shown in FIGS. 11A and 11B, the semiconductor chip J1 includes an emitter electrode J2 of an emitter and a gate wiring layer J3. A heat cycle test is performed with the device with the chip J1. The heat cycle test as a heating and cooling cycle test is such that the chip J1 is cooled down to −65° C. and then, the chip J1 is heated up to +150° C. This thermal-shock test may cause the device to damage. Specifically, the gate wiring layer J3 and the emitter electrode J2 may short. This is, the gate wiring layer J3 contacts the emitter electrode J2.

Figure 12A:
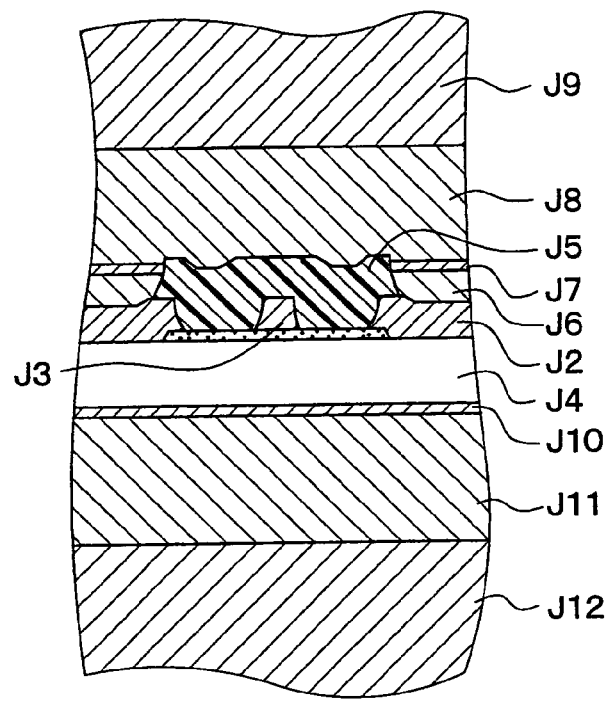
FIGS. 12A and 12B are cross sectional views explaining a stress in the chip as the comparison, according to the first embodiment.
Figure 12B:
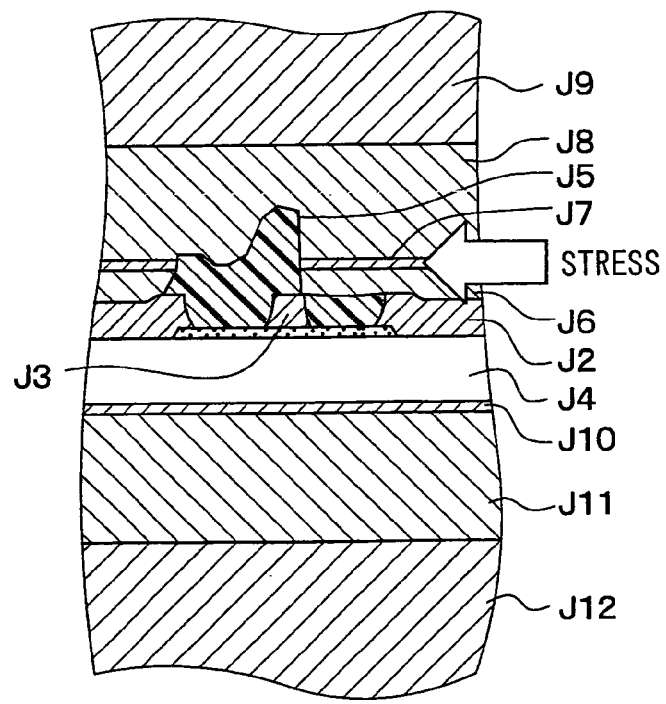

FIG. 12A shows the device J1 before the thermal-shock test is performed, and FIG. 12B shows the device J1 after the thermal shock test is performed. Specifically, FIGS. 12A and 12B are cross sectional views showing the emitter electrode J2 of the device J1. Here, the gate wiring layer J3 provides a gate runner, and the emitter electrode J2 provides a main electrode disposed on a principal surface of the chip J1. The semiconductor chip J1 having a semiconductor power device includes the gate wiring layer J3 made of aluminum and the emitter electrode J2 made of aluminum, which are disposed adjacent each other through a protection film J5. The gate wiring layer J3 electrically connects to a gate electrode. The emitter electrode J2 connects to an emitter region (not shown), which is formed on a surface portion of a silicon substrate J4. A Ni plating layer J6 made of nickel (i.e., Ni) and an Au plating layer J7 made of gold (i.e., Au) are formed on the emitter electrode J2. On the Ni plating layer J6 and the Au plating layer J7, a solder layer J8 and a metal block J9 made of copper (i.e., Cu) are formed. Further, a heat sink (not shown) is mounted on the metal block J9 through another solder layer. A backside electrode J10 is formed on a backside of the silicon substrate J4. The backside electrode J10 connects to a collector region. Another heat sink J12 is bonded to the backside electrode J10 through a solder layer J11.

When the package type semiconductor device is tested with the thermal-shock test in a range between −65° C. and +150° C., a thermal stress is generated in the emitter electrode J2 and the backside electrode J10, which are disposed on both sides of the device J1. This stress is caused by a difference of thermal expansion coefficient between the heat sink J12 and the chip J1 or between the metal block J9 and the chip J1. Since the thermal stress is generated in the electrodes J2, J10, a strain is accumulated in the electrodes J2, J10. Thus, the emitter electrode J2 is damaged in a horizontal direction of the substrate J4 so that the Ni plating layer J6 formed on the emitter electrode J2 is shifted in the horizontal direction. As shown in FIGS. 12A and 12B, the Ni plating layer J6 reaches the gate wiring layer J3 so that the emitter electrode J2 contacts the gate wiring layer J3 through the Ni plating layer J6. Thus, the emitter electrode J2 and the gate wiring layer J3 are electrically connected so that an electric short between the emitter electrode J2 and the gate wiring layer J3 is occurred.

Here, the Ni plating layer J6 and the Au plating layer J8 are formed on the emitter electrode J2, and further, the metal block J9 is formed on the Au plating layer J8. In FIG. 11A, the outer periphery of the metal block J9 is shown as a broken line. Thus, the outer periphery of the metal block J9 almost coincides with the periphery of the emitter electrode J2. In the chip J1, the electric short between the emitter electrode J2 and the gate wiring layer J3 is occurred by a contact between a part of the emitter electrode J2 disposed on an utmost outer periphery of the chip J1 and a part of the gate wiring layer J3 disposed inside of the emitter electrode J2. This mechanism of the electric short is confirmed by the inventors.

Therefore, the stress affects the outer periphery of the metal block J9 specifically. At the outer periphery, the Au plating layer J7 and the Ni plating layer J6 are shifted. Accordingly, it is considered that the shifted Au plating layer J7 and the shifted Ni plating layer J6 are prevented from contacting the gate wiring layer J3 by some parts even when the Au plating layer J7 and the Ni plating layer J6 are shifted at the periphery of the metal block J9. Thus, the emitter electrode J2 and the gate wiring layer J3 are prevented from shorting. Thus, the durability of the chip J1 is improved.

Further, it is considered that the chip J1 has a stress relaxation wiring layer disposed outside of the semiconductor chip J1 and disposed on the outer periphery of the metal block J9 so that the stress generated in the emitter electrode J2 is reduced. Thus, the Ni plating layer J6 and the Au plating layer J7 are prevented from shifting. Thus, the emitter electrode J2 and the gate wiring layer J3 are prevented from shorting so that the durability of the chip J1 is improved.

In view of the above consideration, a package type semiconductor device having a semiconductor chip and a heat radiation plate according to a first embodiment of the present invention is provided. The device has high durability so that a main electrode such as an emitter electrode and a control wiring layer such as a gate wiring layer are protected from shorting.

Figure 1:
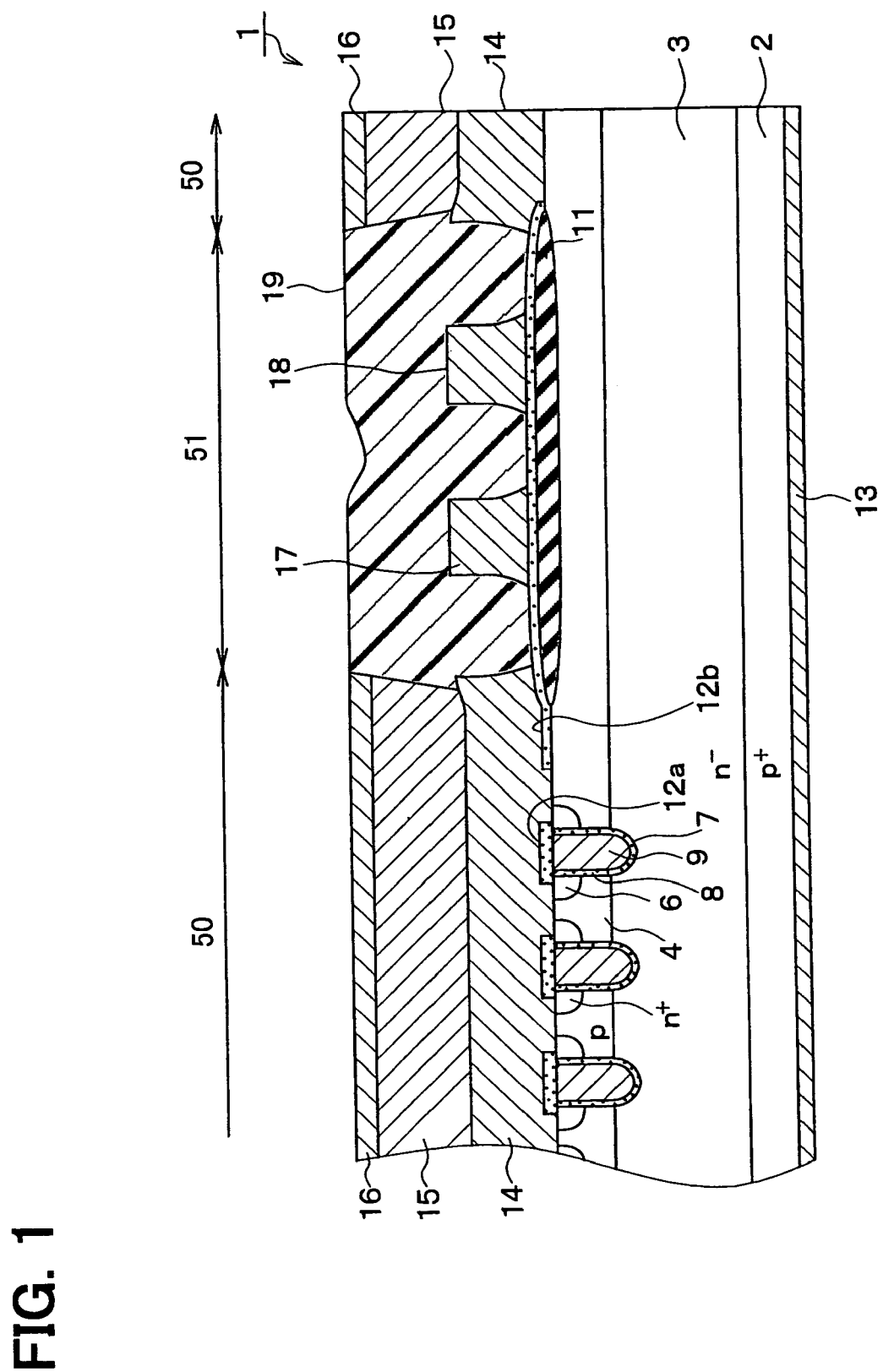
FIG. 1 is a cross sectional view showing a part of a semiconductor chip in a package type semiconductor device according to a first embodiment of the present invention.

FIG. 1 shows the semiconductor chip 1. The chip 1 is formed on a P+ conductive type substrate 2. An N− conductive type drift layer 3 is formed on a principal surface of the substrate 2. The chip 1 includes multiple cell portions 50 and wiring portions 51. Each wiring portion 51 is disposed between the cell portions 50. Here, each cell portion 50 and each wiring portion 51 have same constructions, respectively.

In the cell portion 50, multiple IGBTs are formed. A P type base layer 4 is formed on the surface of the drift layer 3. A N+ type emitter region 6 as the first region is formed on the surface of the base layer 4. A trench 7 is formed to penetrate through the emitter region 6 and the base layer 4 so that the trench 7 reaches the drift layer 3. A gate insulation film 8 and a gate region 9 as the second region are formed in the trench 7. Thus, the gate region 9, the gate insulation film 8 and the trench 7 provide a trench gate construction. An insulation film 12a covers a part of the emitter electrode 6 and the trench gate construction 7–9. The substrate 2 works as a collector region. A collector electrode 13 is formed on the backside of the substrate 2. The collector electrode 13 is made of aluminum, titanium, nickel and gold so that an Al/Ti/Ni/Au multilayered film provides the collector electrode 13. Therefore, when the collector electrode 13 is soldered, solder wettability of the collector electrode 13 becomes excellent. Further, an emitter electrode 14 made of aluminum is formed on the surface of the IGBT. A Ni plating layer 15 and an Au plating layer 16 are formed in this order on the surface of the emitter electrode 14. The Ni plating layer 15 and the Au plating layer 16 correspond to the first metal layer.

Figure 2:
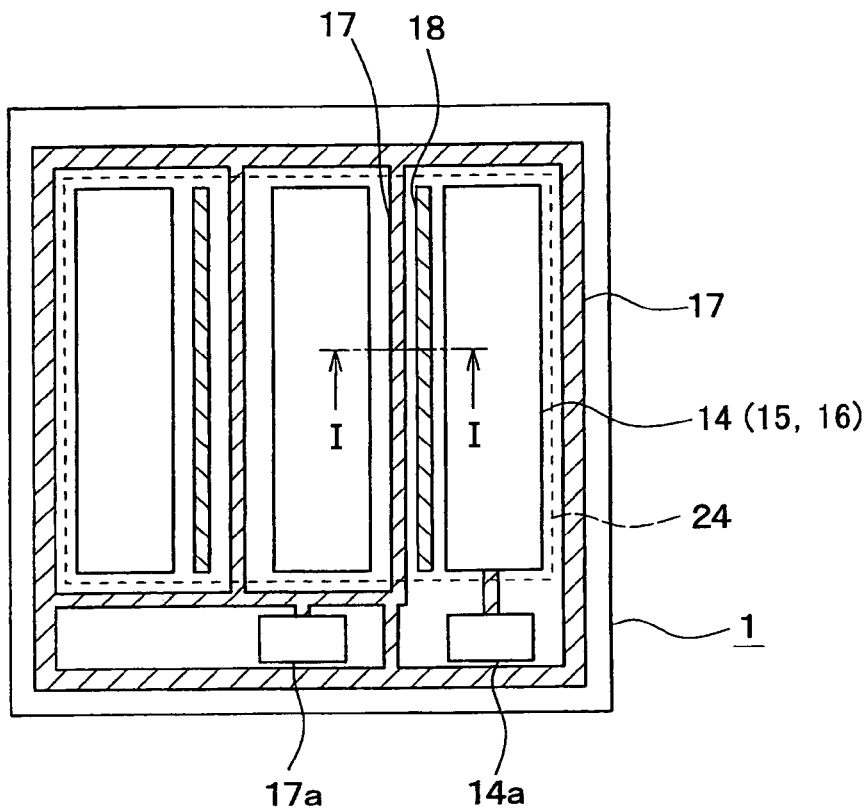
FIG. 2 is a plan view showing the chip, according to the first embodiment.

The emitter electrode 14 corresponds to a main electrode. The emitter electrode 14 contacts the base layer 4 and the emitter region 6 in each IGBT, which is formed in the cell portion 50. Here, multiple IGBTs are formed in one cell portion 50. Specifically, the emitter electrode 14 in the cell portion 50 is disposed on multiple trench gate constructions. As shown in FIG. 2, the emitter electrode 14 covers almost whole area of the cell portion 50. In the IGBT, the trench gate construction extends in a direction parallel to a longitudinal direction of the emitter electrode 14. Thus, the extension direction of the emitter electrode 14 is parallel to the extension direction of the trench gate construction. In the chip 1, multiple cell portions 50 are formed. In FIG. 2, three cell portions 50 are formed in the chip 1. Thus, the emitter electrodes 14 are disposed stripe shaped. The emitter electrode 14 is made of, for example, aluminum alloy such as Al—Si alloy. The emitter electrode 14 is formed by a sputtering method. The emitter electrode 14 is electrically connected to an emitter electrode pad 14a so that the emitter region 6 and the base layer 4 are ground through the emitter electrode pad 14a.

The Ni plating layer 15 is formed on whole surface of the emitter electrode 14 so that the Ni plating layer 15 connects to the emitter electrode 14 electrically. The Ni plating layer 15 is made of metallic film. The Ni plating layer 15 is formed of an electroless plating method. The Au plating layer 16 is formed on whole surface of the Ni plating layer 15 so that the Au plating layer 16 is connected to the Ni plating layer 15 electrically. The Au plating layer 16 is capable of soldering. The Au plating layer 16 is made of metal film. The Au plating layer 16 is, for example, formed of a wet electroless plating method.

In the wiring portion 51, a LOCOS (local oxidation of silicon) film 11 and an insulation film 12b are formed on the surface of the base layer 4. A gate wiring layer 17 and a dummy wiring layer 18 are formed on the LOCOS film 11 through the insulation film 12b. Here, the dummy wiring layer 18 works as a blocking member to stop the stress applied to the chip 1. The gate wiring layer 17 works as a control wiring layer. The gate wiring layer 17 is connected to multiple gate regions 9 in the cell portion 50 electrically. The gate wiring layer 17 controls a gate potential in each trench gate construction. Specifically, the gate wiring layer 17 controls a voltage to be applied to the chip 1. The gate wiring layer 17 has a thickness about 5.5 µm and a width about 40 µm. The gate wiring layer 17 is disposed between the emitter electrodes 14 so that the gate wiring layer 17 is disposed stripe shaped. The gate wiring layer 17 includes two parts. One part of the gate wiring layer 17 extends toward the extension direction of the emitter electrode 14. The other part of the gate wiring layer 17 extends toward a direction perpendicular to the extension direction of the emitter electrode 14. Two parts of the gate wiring layer 17 are connected each other so that the gate wiring layer 17 surrounds the emitter electrode 14. As shown in FIG. 2, the chip 1 includes a gate electrode pad 17a for connecting to the gate wiring layer 17. The gate potential for applying to the gate wiring layer 17 is controlled through the gate electrode pad 17a.

The dummy wiring layer 18 is disposed between the gate wiring layer 17 and the emitter electrode 14. Specifically, the dummy wiring layer 18 is disposed between the utmost outer emitter electrode 14 and the gate wiring layer 17, which is disposed inside of the utmost outer emitter electrode 14. The utmost outer emitter electrode 14 is disposed outside of the chip 1. The dummy wiring layer 18 extends in a direction parallel to the one part of the gate wiring layer 7, which is sandwiched between the emitter electrodes 14. The length of the dummy wiring layer 18 in a longitudinal direction is almost the same as the length of the emitter electrode 14 in the longitudinal direction. The dummy wiring layer 18 has a thickness about 5.5 µm and a width about 40 µm. Therefore, the thickness of the dummy wiring layer 18 is almost the same as the emitter electrode 14 and the gate wiring layer 17. The distance between the dummy wiring layer 18 and the gate wiring layer 17 is about 10 µm, and the distance between the dummy wiring layer 18 and the emitter electrode 14 is also 10 µm. The dummy wiring layer 18 is electrically separated from the gate wiring layer 17, the emitter electrode 14 and the collector electrode 20. Thus, the dummy wiring layer 18 is not electrically connected to other electrodes so that the dummy wiring layer 18 becomes electrically neutral.

Figure 3:
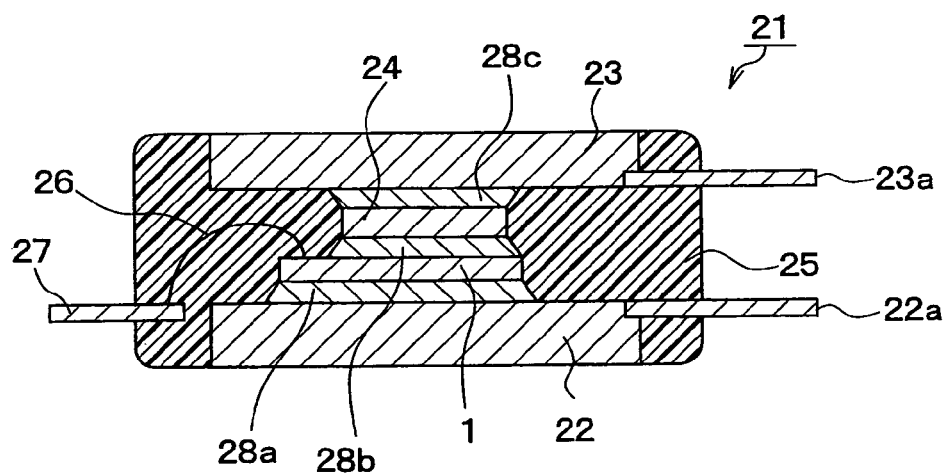
FIG. 3 is a cross sectional view showing the device according to the first embodiment.

A protection film 19 covers the surface of the gate wiring layer 17 and the surface of the dummy wiring layer 18. The protection film 19 electrically separates and isolates among the gate wiring layer 17, the dummy wiring layer 18 and the emitter electrode 14 together. FIG. 3 shows a package type semiconductor device 21 having the semiconductor chip 1. The device 21 includes the chip 1 having the IGBTs, a lower heat sink 22, an upper heat sink 23, a metal block 24, a pair of lead terminals 22a, 23a, and a resin mold 25. A pair of the lead terminals 22a, 23a is connected to the lower and upper heat sinks 22, 23, respectively. The resin mold 25 seals the chip 1, the upper and lower heat sinks 22, 23, the metal block 24 and a pair of the lead terminals 22a, 23a. The gate electrode pad 17a of the IGBT in the chip 1 and another lead terminal 27 are connected together with a wire 26. One side of the upper or lower heat sinks 22, 23 is exposed from the resin mold 25. Thus, the heat sink 22, 23 works as a heat radiation plate. Further, one end of the lead terminal 22a, 23a or the other terminal 27 is exposed from the resin mold 25.

A solder layer 28a is disposed between the upper surface of the lower heat sink 22 and the lower side of the chip 1. Another solder layer 28b is disposed between the upper side of the chip 1 and the lower surface of the metal block 24. Further another solder layer 28c is disposed between the upper surface of the metal block 24 and the lower surface of the upper heat sink 23. Thus, the emitter electrode 14 of the IGBT formed in the chip 1 is connected to an external circuit through the upper heat sink 23. The collector electrode 13 of the IGBT in the chip 1 is connected to the external circuit through the lower heat sink 22.

The upper and lower heat sinks 22, 23 works as a heat radiation plate for radiating heat generated in the chip 1. The heat sinks 22, 23 are made of metal such as copper, which has excellent heat conductivity and low resistance.

The metal block 24 works as a path for conducting the heat generated in the chip 1 to the upper heat sink 23. The metal block 24 is also made of copper. In FIG. 2, a broken line 24 shows an outline of the metal block 24 of the device 21 including the chip 1. Therefore, the outer periphery of the metal block 24 coincides with the periphery of the emitter electrode 14. Further, the metal block 24 covers whole surface of the emitter electrode 14.

Figure 4A:
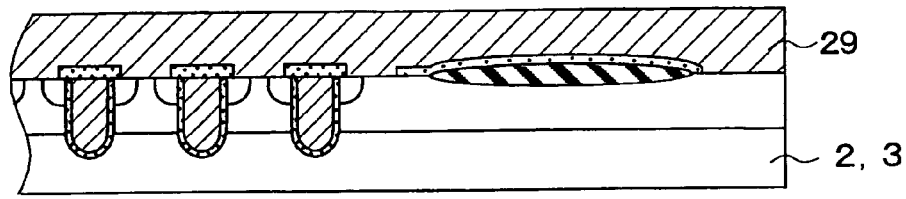
FIGS. 4A–4D are cross sectional views explaining a method for manufacturing the device according to the first embodiment.
Figure 4B:
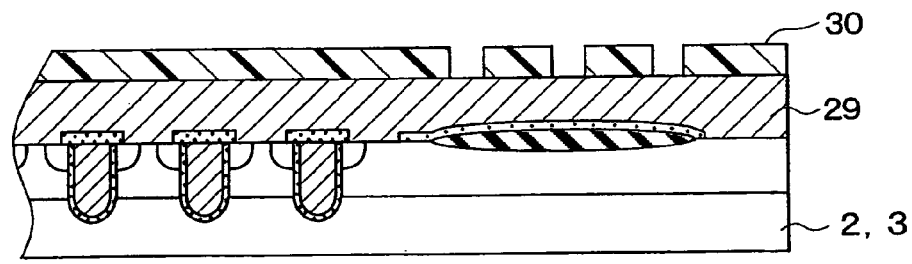

Next, a manufacturing method for manufacturing the device 21 is described with reference to FIGS. 4A–4D. Firstly, a semiconductor substrate having the P+ type substrate 2 and the N− type drift layer 3 is prepared. The drift layer 3 is formed on the principal surface of the substrate 2. Then, the IGBTs are formed on the substrate 2. The IGBT is formed by a conventional manufacturing method. Specifically, the P type base layer 4 and the N+ type emitter region 6 are formed on the surface of the N− type drift layer 3. Then, the trench 7 is formed in such a manner that the trench 7 penetrates through the emitter region 6 and the base layer 4 and reaches the drift layer 3. The gate insulation film 8 is formed on the inner wall of the trench 7. Then, the gate region 9 is formed in the trench 7 through the gate insulation film 8. The insulation film 12a is formed in such a manner that the insulation film 12a covers a part of the emitter region 6 and the trench 7. As shown in FIG. 4A, a metal film 29 having the thickness of about 5.5 μm is formed on the principal surface of the substrate 2. The metal film 29 is made of aluminum and the like. In FIG. 4B, a photo resist 30 is applied on the surface of the metal film 29. Then, the photo resist is patterned in to a predetermined pattern by using a photo lithography method. Thus, a part of the photo resist is opened, and the other part of the photo resist is remained to form the emitter electrode 14, the gate wiring layer 17 and the dummy wiring layer 18.

Figure 4C:
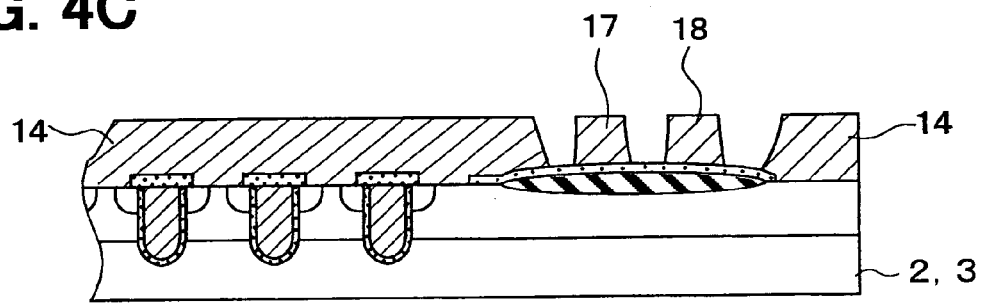
Figure 4D:
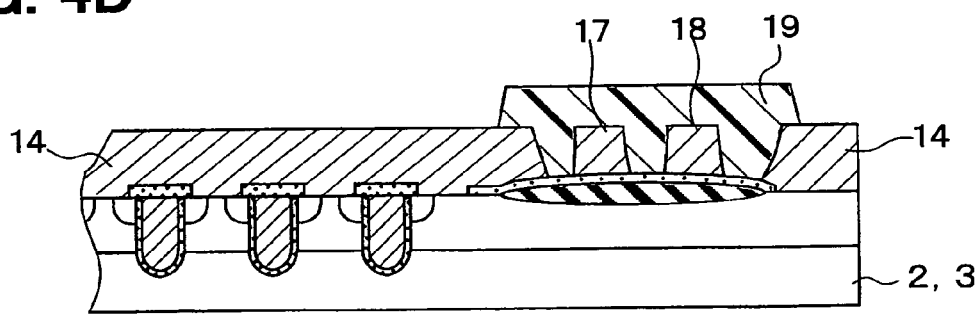

As shown in FIG. 4C, the metal film 29 is etched by using the patterned photo resist 30 as a mask so that the metal film 29 has a predetermined pattern. Thus, the emitter electrode 14, the gate wiring layer 17 and the dummy wiring layer 18 are formed at the same time. Then, the photo resist 30 is removed. In FIG. 4D, a poly-imide film is formed on whole surface of the substrate 2 including the upper surfaces of the emitter electrode 14, the gate wiring layer 17 and the dummy wiring layer 18. Then, a part of the poly-imide film is removed so that the protection film 19 is formed. Thus, the protection film 19 penetrates among the emitter electrode 14, the gate wiring layer 17 and the dummy wiring layer 18 so that they are electrically isolated each other.

Then, a Ni plating film and an Au plating film are formed by the electroless plating method. Thus, the Ni and Au plating films are formed on a portion of the substrate 2, which is not covered with the protection film 19. Accordingly, the Ni plating layer 15 and the Au plating layer 16 are formed on the surface of the emitter electrode 14. Further, the gate electrode pad 17a for electrically connecting to the gate wiring layer 17 and the emitter electrode pad 14a for electrically connecting to the emitter electrode 14 are formed.

An Al/Ti/Ni/Au film is formed on the backside of the substrate 2. Specifically, an aluminum film, an titanium film, a nickel film, and a gold film are formed on the backside of the substrate 2 by an evaporation method. Thus, the collector electrode 13 is formed. After that, the substrate 2 is cut into a chip 1 by a dicing cut method.

Thus, the semiconductor chip 1 is completed. Then, the lower heat sink 22 is bonded to the chip 1 through the solder layer 28a, and the metal block 24 is bonded to the chip 1 through the solder layer 28b. Then, the gate electrode pad 17a and the lead terminal 27 are connected with the wire 26. Next, the upper heat sink 23 is bonded to the chip 1 through the solder layer 28c. Then, the chip 1 with parts is mounted in a casting for forming the package type semiconductor device 21. In the casting, melted resin is cast. Thus, the resin mold 25 seals the chip 1 with other parts so that the device 21 is completed.

Here, the substrate 2 and the drift layer 3 have the thermal expansion coefficient about 3 ppm/° C. The lower heat sink 22, the upper heat sink 23 and the metal block 24 have the thermal expansion coefficient about 17 ppm/° C. When atmospheric temperature of the device 21 is changed, the stress is applied to the emitter electrode 14 and the collector electrode 13, which are disposed on both sides of the chip 1. This is because a difference of the thermal expansion coefficient between the substrate 2 or the drift layer 3 and the lower heat sink 22, the upper heat sink 23 or the metal block 24.

Figure 5A:
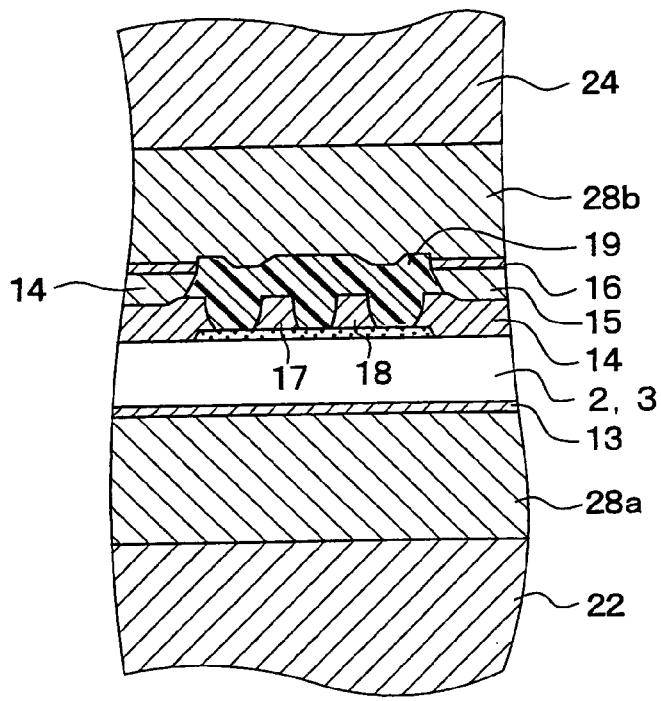
FIGS. 5A and 5B are cross sectional views explaining a stress in the chip, according to the first embodiment.
Figure 5B:
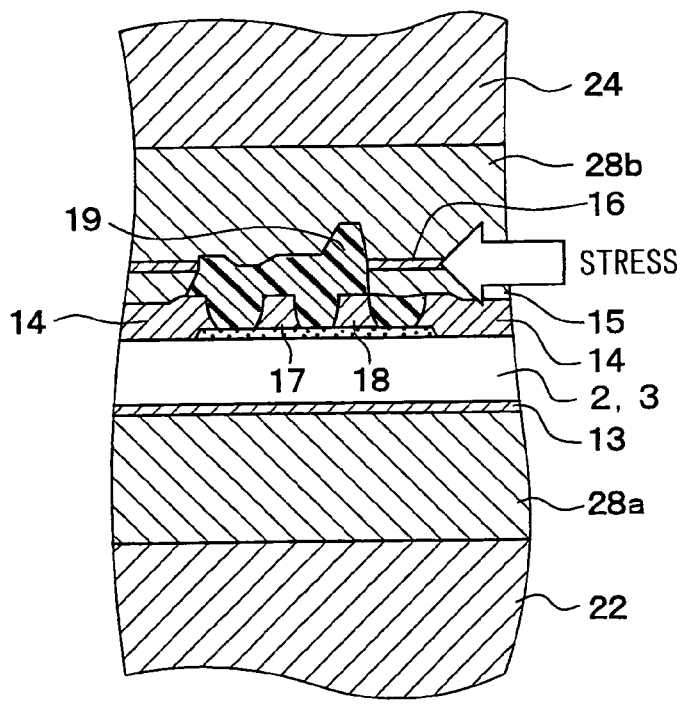

Here, the thermal-shock test is performed with the device 21. FIG. 5A shows the chip 1 of the device 21 before the thermal-shock test is performed. FIG. 5B shows the chip 1 of the device 21 after the thermal-shock test. As shown in FIG. 5A, the protection film 19 is uniformly disposed between the emitter electrodes 14. Specifically, the left side emitter electrode 14 and the right side emitter electrode 14 are disposed appropriately in a predetermined arrangement.

After the thermal-shock test is performed, the Ni plating layer 15 and the Au plating layer 16 are shifted so that the protection film 19 is pushed. Thus, the protection film 19 is pressed and contacts the dummy wiring layer 18. Further, the Ni and Au plating layers 15, 16 are also pressed and contact the dummy wiring layer 18. This is because the stress applied to the emitter electrode 14 in the cell portion 50 may cause to crack a part of the Ni plating layer 15 and/or the emitter electrode 14. Thus, the Ni and Au plating layers 15, 16 are pressed and shifted by the stress.

Although the Ni and Au plating layers 15, 16 are shifted, the Ni and Au plating layers 15, 16 are stopped by the dummy wiring layer 18. Accordingly, the dummy wiring layer 18 can prevent the Ni and Au plating layers 15, 16 from shifting further more. Here, the dummy wiring layer 18 is electrically neutral so that the dummy wiring layer 18 is not electrically connected to other parts such as the gate wiring layer 17, the collector electrode 13 and the emitter electrode 14. Therefore, even when the Ni and Au plating layers 15, 16 contact the dummy wiring layer 18, no short circuit is occurred in the chip 1. Thus, the IGBT works correctly.

Thus, since the dummy wiring layer 18 is disposed between the gate wiring layer 17 and the emitter electrode 14, the dummy wiring layer 18 stops the shift of the Ni and Au plating layers 15, 16. Therefore, although the Ni and Au plating layers 15, 16 contact the dummy wiring layer 18, the Ni and Au plating layers 15, 16 do not contact the gate wiring layer 17. Accordingly, the dummy wiring layer 18 protects the chip 1 from shorting between the gate wiring layer 17 and the emitter electrode 14. Thus, the thermal durability of the device 21 is improved so that the device 21 has high durability. Here, the dummy wiring layer 18 works as a blocking member for suppressing the shift of the Au and Ni plating layers 15, 16. Further, the dummy wiring layer 18 works as the blocking member for changing a direction of the shift of the Au and Ni plating layers 15, 16.

Although the dummy wiring layer 18 disposed between the emitter electrode 14 and the gate wiring layer 17 includes only one layer, multiple layers as the dummy wiring layer 18 can be disposed between the emitter electrode 14 and the gate wiring layer 17.

Although the dummy wiring layer 18 is isolated from the collector electrode 13, the emitter electrode 14 and the gate wiring layer 17, the dummy wiring layer 18 can connect to the emitter electrode 14 electrically.

Although the emitter electrode 14 in the chip 1 includes three parts as shown in FIG. 2, the emitter electrode 14 can include multiple parts such as two parts. Further, the emitter electrode 14 can include only one part in the chip 1.

The dummy wiring layer 18 is disposed between the utmost outer emitter electrode 14 and the neighboring gate wiring layer 17 adjacent to the utmost outer emitter electrode 14. This is because the dummy wiring layer 18 is disposed at the above position, to which the stress is mainly applied. However, the dummy wiring layer 18 can be disposed between another emitter electrode 14 and another gate wiring layer 17. When the emitter electrode 14 includes multiple parts more than three parts, the dummy wiring layer 18 can be disposed not only between the utmost outer emitter electrode 14 and the neighboring gate wiring layer 17 but also between an inner emitter electrode 14 and the neighboring gate wiring layer 17 adjacent to the inner emitter electrode 14. Here, the inner emitter electrode 14 is disposed inside of the utmost outer emitter electrode 14.

Although the emitter electrode 14 is made of aluminum, the emitter electrode 14 can be made of another material. Although the Ni plating layer 15 and the Au plating layer 16 are disposed on the emitter electrode 14, another metallic layer can be disposed on the emitter electrode 14.

Although the dummy wiring layer 18 includes only one line between the gate wiring layer 17 and the emitter electrode 14, the dummy wiring layer 18 can include multiple lines between the gate wiring layer 17 and the emitter electrode 14. Further, although the dummy wiring layer 18 is formed of a continuous line, the dummy wiring layer 18 can be formed of a dotted line, which is composed of multiple line segments.

Although the semiconductor chip 1 includes the IGBT, the chip 1 can include another semiconductor device such as a vertical type power MOSFET.

(Second Embodiment)

Figure 6:
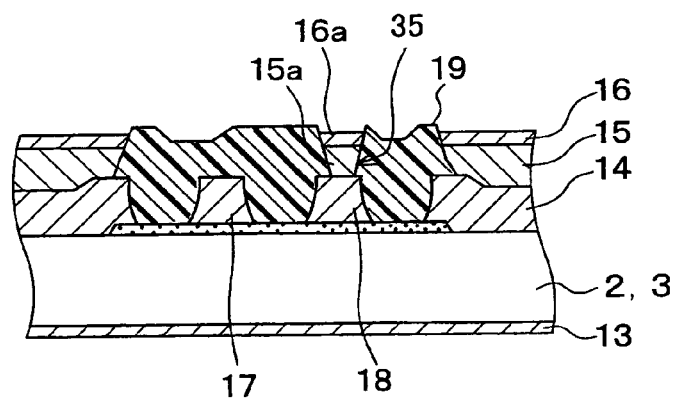
FIG. 6 is a cross sectional view showing the chip of a semiconductor device according to a second embodiment of the present invention.

A package type semiconductor device 221 having the semiconductor chip 1 according to a second embodiment of the present invention is shown in FIG. 6. The chip 1 of the device 221 includes an additional Ni plating layer 15a and an additional Au plating layer 16a, which are formed on the surface of the dummy wiring layer 18. The Ni and Au plating layers 15a, 16a correspond to the second metal layer. The Ni and Au plating layers 15a, 16a provide a blocking member 35. The blocking member 35 is disposed on the surface of the chip 1 so that the blocking member 35 is disposed in a shifting direction of the Ni and Au plating layers 15, 16 disposed on the emitter electrode 14. Therefore, the blocking member 35 prevents the Ni and Au plating layers 15, 16 from shifting in a surface direction of the chip 1, which is the shifting direction.

Thus, the blocking member 35 can be disposed on the surface of the dummy wiring layer 18. The blocking member 35 is formed by the electroless plating method. Specifically, the blocking member 35 composed of the Ni and Au plating layers 15a, 16a is formed after no protection film 19 is formed on the dummy wiring layer 18 in the process for forming the protection film 19, which is performed by using a mask for covering the surface of the dummy wiring layer 18 so that the surface of the dummy wiring layer is not covered with the protection film 19.

In this device 221, both of the dummy wiring layer 18 and the blocking member 35 protect the chip 1 from shorting between the gate wiring layer 17 and the emitter electrode 14. Thus, the thermal durability of the device 221 is much improved so that the device 221 has high durability.

Although the blocking member 35 is composed of the Au and Ni plating layers 15a, 16a, the blocking member 35 can be formed of another metallic layer. Further the blocking member 35 can be formed of another multi-layered film.

Although the blocking member 35 includes only one line between the gate wiring layer 17 and the emitter electrode 14, the blocking member 35 can include multiple lines between the gate wiring layer 17 and the emitter electrode 14. Further, although the blocking member 35 is formed of a continuous line, the blocking member 35 can be formed of a dotted line, which is composed of multiple line segments.

(Third Embodiment)

Figure 7:
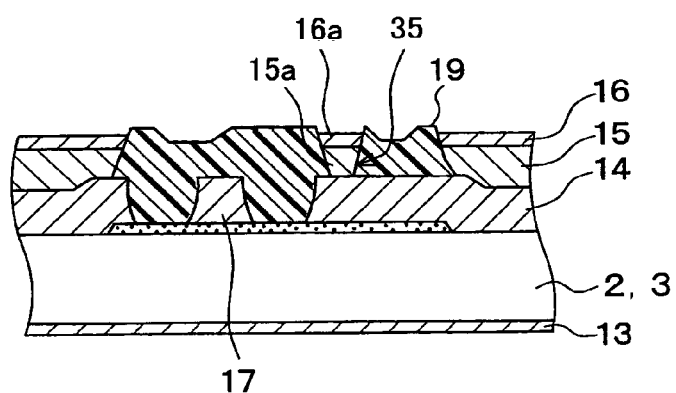
FIG. 7 is a cross sectional view showing the chip of a semiconductor device according to a third embodiment of the present invention.

A package type semiconductor device 321 having the semiconductor chip 1 according to a third embodiment of the present invention is shown in FIG. 7. The chip 1 of the device 321 includes the blocking member 35 with no dummy wiring layer 18. In the device 321, the emitter electrode 14 disposed on the utmost outer periphery of the chip 1 extends near the gate wiring layer 17. The blocking member 35 is formed on the surface of the emitter electrode 14. Specifically, the blocking member composed of the Au and Ni plating layers 15a, 16a is disposed on one end of the emitter electrode 14, which is near the gate wiring layer 17. The blocking member 35 is separated from the Ni and Au plating layers 15, 16 disposed on the emitter electrode 14 in the cell portion 50. The protection film 19 is disposed between the blocking member 35 and the Ni and Au plating layers 15, 16.

In this device 321, the blocking member 35 is disposed on the surface of the chip 1 so that the blocking member 35 is disposed in a shifting direction of the Ni and Au plating layers 15, 16 disposed on the emitter electrode 14 in the cell portion 50. Therefore, the blocking member 35 prevents the Ni and Au plating layers 15, 16 from shifting in a surface direction of the chip 1, which is the shifting direction. Thus, the thermal durability of the device 321 is improved so that the device 321 has high durability.

(Fourth Embodiment)

Figure 8:
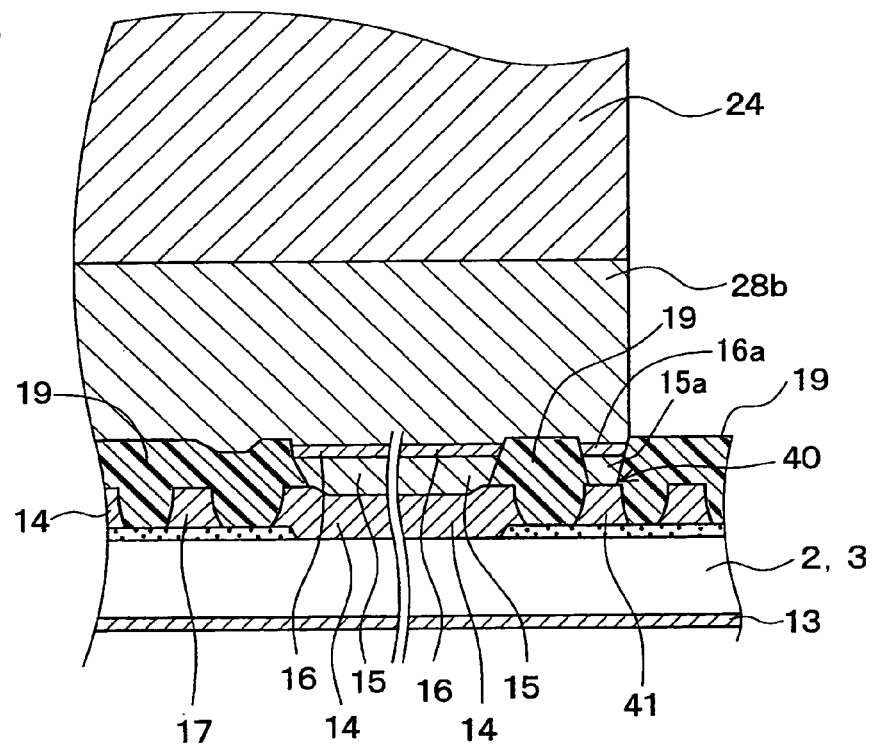
FIG. 8 is a cross sectional view showing the chip of a semiconductor device according to a fourth embodiment of the present invention.
Figure 9:
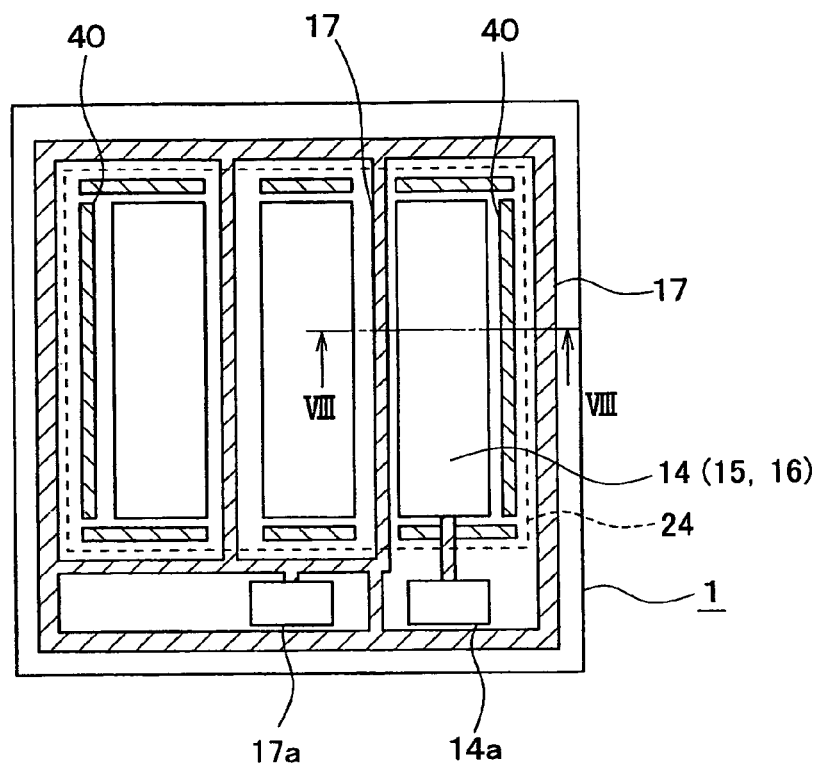
FIG. 9 is a plan view showing the chip, according to the fourth embodiment.

A package type semiconductor device 421 having the semiconductor chip 1 according to a fourth embodiment of the present invention is shown in FIGS. 8 and 9. The chip 1 includes a stress relaxation wiring layer 40 with no dummy wiring layer 18. The stress relaxation wiring layer 40 is disposed outside of the utmost outer emitter electrode 14, which is disposed utmost outside of the chip 1. Thus, the stress relaxation wiring layer 40 is disposed between the gate wiring layer 17 and the utmost outer emitter electrode 14. As shown in FIG. 9, the stress relaxation wiring layer 40 extends toward the extension direction of the emitter electrode 14, i.e., the longitudinal direction of the emitter electrode 14.

The stress relaxation wiring layer 40 includes an aluminum wiring layer 41, the Ni plating layer 15*a* and the Au plating layer 16*a*. The width of the stress relaxation wiring layer 40 is about 40 $\mu$m. The distance between the stress relaxation wiring layer 40 and the gate wiring layer 17 is about 10 $\mu$m, and the distance between the emitter electrode and the stress relaxation wiring layer 40 is also about 10 $\mu$m. The stress relaxation wiring layer 40 is electrically isolated from the gate wiring layer 17, the emitter electrode 14 and the collector electrode 20 so that the stress relaxation wiring layer 40 is not connected to other electrode and becomes electrically neutral. However, the stress relaxation wiring layer 40 can be electrically connected to the emitter electrode 14.

The outer periphery of the metal block 24 is disposed on the stress relaxation wiring layer 40. The stress relaxation wiring layer 40 connects to the periphery of the metal block 24 through the solder layer 28*b*. In this device 421, since the stress is generated at the periphery of the metal block 24, the stress is applied to the stress relaxation wiring layer 40. Therefore, the Ni and Au plating layers 15*a*, 16*a* of the stress relaxation wiring layer 40 are shifted so that the stress is absorbed in the stress relaxation wiring layer 40. This is, the stress relaxation wiring layer 40 stops the stress so that the stress is not applied to the emitter electrode 14 substantially. This is because the emitter electrode 14 is disposed inside of the stress relaxation wiring layer 40.

Accordingly, the emitter electrode 14 does not contact the gate wiring layer 17. Therefore, the electric short between the emitter electrode 14 and the gate wiring layer 17 is prevented. Thus, the thermal durability of the device 421 is improved so that the device 421 has high durability.

In this embodiment, the Ni and Au plating layers 15*a*, 16*a* of the stress relaxation wiring layer 40 may shift to contact the emitter electrode 14 adjacent to the stress relaxation wiring layer 40 so that the stress relaxation wiring layer 40 and the emitter electrode 14 short. However, since the stress relaxation wiring layer 40 is electrically neutral or electrically contacted the emitter electrode 14, the electric shirt between the stress relaxation wiring layer 40 and the emitter electrode 14 does not cause a problem. Therefore, the device 421 can work appropriately.

Although the stress relaxation wiring layer 40 includes only one line between the utmost outer emitter electrode 14 and the gate wiring layer 17, the stress relaxation wiring layer 40 can include multiple lines between the utmost outer emitter electrode 14 and the gate wiring layer 17. Further, although the stress relaxation wiring layer 40 is formed of a continuous line, the stress relaxation wiring layer 40 can be formed of a dotted line, which is composed of multiple line segments.

(Fifth Embodiment)

Figure 10:
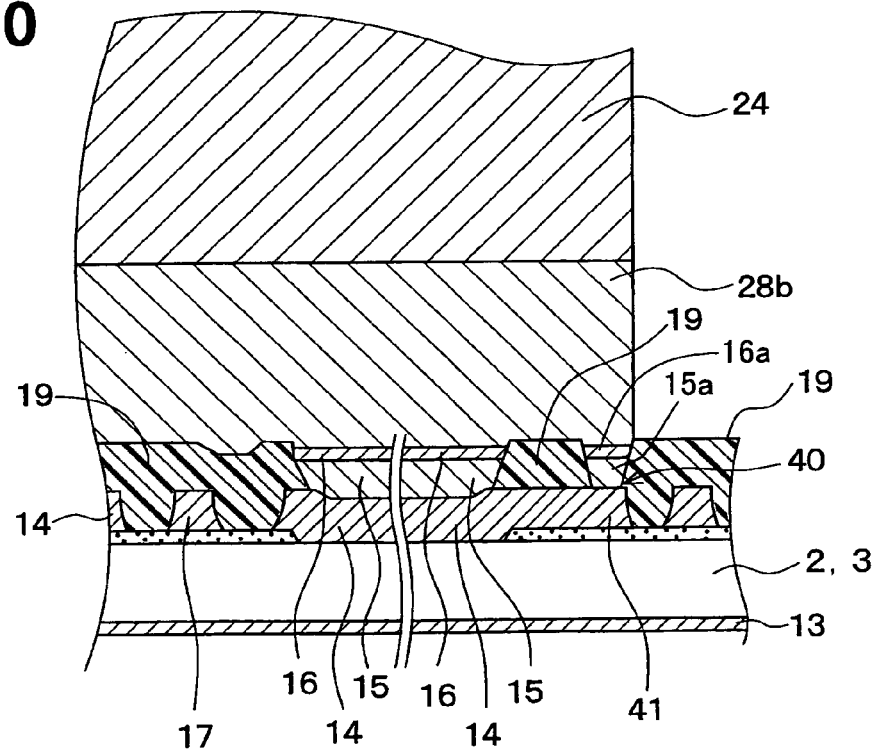
FIG. 10 is a cross sectional view showing the chip of a semiconductor device according to a fifth embodiment of the present invention.

A package type semiconductor device 521 having the semiconductor chip 1 according to a fifth embodiment of the present invention is shown in FIG. 10. In the chip 1, the emitter electrode 14 and the aluminum wiring layer 41 are physically connected. Specifically, the utmost outer emitter electrode 14 and the Al wiring layer 41 are electrically connected. In this case, the stress relaxation wiring layer 40 is electrically connected to the emitter electrode 14.

In the chip 1, the stress relaxation wiring layer 40 stops the stress so that the stress is not applied to the emitter electrode 14 substantially. This is because the emitter electrode 14 is disposed inside of the stress relaxation wiring layer 40. Accordingly, the emitter electrode 14 does not contact the gate wiring layer 17. Therefore, the electric short between the emitter electrode 14 and the gate wiring layer 17 is prevented. Thus, the thermal durability of the device 421 is improved so that the device 521 has high durability.

Such changes and modifications are to be understood as being within the scope of the present invention as defined by the appended claims.

What is claimed is:

1. A package type semiconductor device comprising:
   a semiconductor chip having a semiconductor part;
   a main electrode disposed on a principal surface of the chip for electrically connecting to a first region of the semiconductor part;
   a control wiring layer disposed on the principal surface of the chip for electrically connecting to a second region of the semiconductor part and for controlling an electric potential of the second region of the semiconductor part;
   a blocking member disposed on the principal surface of the chip and electrically isolated from the control wiring layer;
   a first metallic layer disposed on the principal surface of the chip;
   a protection film disposed among the main electrode, the control wiring layer and the blocking member; and
   a metal block for covering at least a part of the main electrode and the control wiring layer and for electrically connecting to the main electrode through the first metallic layer,
   wherein the chip, the main electrode, the control wiring layer, the blocking member, and the metal block are packaged, and
   wherein the blocking member is disposed between the main electrode and the control wiring layer.

2. The device according to claim 1,
   wherein the blocking member includes a dummy wiring layer.

3. The device according to claim 2,
   wherein the blocking member further includes a second metallic layer disposed on the dummy wiring layer.

4. The device according to claim 2,
   wherein the dummy wiring layer has a width almost equal to a width of the control wing layer.

5. The device according to claim 2,
   wherein the dummy wiring layer and the control wiring layer have a distance therebetween, and
   wherein the dummy wiring layer and the main electrode have another distance therebetween, which is almost the same as the distance between the dummy wiring layer and the control wiring layer.

6. The device according to claim 1,
   wherein the blocking member includes a dummy wiring layer and a plating electrode disposed on the dummy wiring layer.

7. The device according to claim 1,
   wherein the main electrode includes a plurality of stripe shaped lines,
   wherein the control wiring layer is disposed between two of the stripe shaped lines of the main electrode to extend in an extension direction, and
   wherein the blocking member is parallel to the main electrode and the control wiring layer.

8. The device according to claim 7,
wherein the blocking member includes a dummy wiring layer,
wherein the main electrode includes an utmost outer stripe shaped line, which is disposed utmost outside of the chip, and
wherein the dummy wiring layer is disposed between the utmost outer stripe shaped line of the main electrode and a neighboring control wiring layer, which is disposed adjacent to the utmost outer stripe shaped line of the main electrode.

9. The device according to claim 1,
wherein the blocking member includes a plating electrode.

10. The device according to claim 9,
wherein the protection film is disposed between the main electrode and the control wiring layer, and disposed between the control wiring layer and the plating electrode.

11. The device according to claim 10,
wherein the main electrode includes a plurality of stripe shaped lines,
wherein the control wiring layer is disposed between two of the stripe shaped lines of the main electrode to extend in an extension direction, and
wherein the plating electrode is parallel to the main electrode and the control wiring layer.

12. The device according to claim 11,
wherein the main electrode includes an utmost outer stripe shaped line, which is disposed utmost outside of the chip, and
wherein the plating electrode is disposed between the utmost outer stripe shaped line of the main electrode and a neighboring control wiring layer, which is disposed adjacent to the utmost outer stripe shaped line of the main electrode.

13. A package type semiconductor device comprising:
a semiconductor chip having a semiconductor part;
a main electrode disposed on a principal surface of the chip for electrically connecting to a first region of the semiconductor part;
a control wiring layer disposed on the principal surface of the chip for electrically connecting to a second region of the semiconductor part and for controlling an electric potential of the second region of the semiconductor part;
a stress relaxation wiring layer disposed on the principal surface of the chip and electrically isolated from the control wiring layer;
a first metallic layer disposed on the principal surface of the chip;
a second metallic layer disposed on a surface of the stress relaxation wiring layer;
a protection film for covering the main electrode, the control wiring layer and the stress relaxation wiring layer; and
a metal block for covering at least a part of the main electrode and the control wiring layer for electrically connecting to the main electrode through the first metallic layer,
wherein the chip, the main electrode, the control wiring layer, the stress relaxation wiring layer, and the metal block are packaged, and
wherein the stress relaxation wiring layer is disposed outside of the main electrode and connect to the metal block.

14. The device according to claim 13,
wherein the stress relaxation wiring layer includes a dummy wiring layer.

15. The device according to claim 13,
wherein the main electrode includes a plurality of stripe shaped lines,
wherein the control wiring layer is disposed between two of the stripe shaped lines of the main electrode to extend in an extension direction, and
wherein the stress relaxation wiring layer is parallel to the main electrode and the control wiring layer.

* * * * *